(12) United States Patent
Egloff et al.

(10) Patent No.: US 11,875,848 B2
(45) Date of Patent: Jan. 16, 2024

(54) BUFFER MEMORY ADAPTED TO IMPLMENT CALCULATIONS HAVING OPERANDS AS DATA

(71) Applicants: Commissariat à l'Energie Atomique et aux Energies Alternatives, Paris (FR); CENTRE NATIONAL DE LA RECHERCHE SCIENTIFIQUE, Paris (FR); Université d'Aix-Marseille, Marseilles (FR)

(72) Inventors: Valentin Egloff, Grenoble (FR); Jean-Philippe Noel, Grenoble (FR); Jean-Michel Portal, Saint-Savournin (FR)

(73) Assignees: Commissariat à l'Energie Atomique et aux Energies Alternatives, Paris (FR); Université d'Aix-Marseille, Marseilles (FR); Centre National De La Recherche Scientifique, Paris (FR)

( * ) Notice: Subject to any disclaimer, the term of this patent is extended or adjusted under 35 U.S.C. 154(b) by 0 days.

(21) Appl. No.: 17/648,449

(22) Filed: Jan. 20, 2022

(65) Prior Publication Data
US 2022/0246211 A1 Aug. 4, 2022

(30) Foreign Application Priority Data
Jan. 29, 2021 (FR) ...................................... 2100866

(51) Int. Cl.
*G11C 14/00* (2006.01)
*G06F 3/06* (2006.01)

(52) U.S. Cl.
CPC ........ *G11C 14/0063* (2013.01); *G06F 3/0656* (2013.01)

(58) Field of Classification Search
CPC ................................. G11C 16/10; G11C 16/26
See application file for complete search history.

(56) References Cited

U.S. PATENT DOCUMENTS

| 9,406,346 B2 * | 8/2016 | D'Abreu ............. G06F 11/1048 |
| 9,728,255 B2 * | 8/2017 | Franca-Neto .......... H10B 99/00 |
| 9,910,669 B2 * | 3/2018 | Doshi ................. G06F 9/30036 |
| 10,043,581 B2 | 8/2018 | Noel et al. |

(Continued)

FOREIGN PATENT DOCUMENTS

| EP | 3252774 A1 | 12/2017 |
| EP | 3503103 A1 | 6/2019 |
| WO | 2013016723 A2 | 1/2013 |

OTHER PUBLICATIONS

Preliminary Search Report for French Application No. 2100866 dated Aug. 30, 2021, 2 pages.

*Primary Examiner* — Kretelia Graham
(74) *Attorney, Agent, or Firm* — Moreno IP Law LLC

(57) ABSTRACT

The present description concerns a memory device (200) including a non-volatile memory circuit (101); a buffer memory circuit (203) comprising a volatile memory circuit (221); an input-output circuit (105); a first data link (104) coupling the non-volatile memory circuit (101) to the buffer memory circuit (203); a second data link (106) coupling the buffer memory circuit (203) to the input-output circuit (105); and a control circuit (225), wherein the buffer memory circuit (203) is adapted to implementing calculations having as operands data stored in the volatile memory circuit (221).

13 Claims, 1 Drawing Sheet

(56) References Cited

U.S. PATENT DOCUMENTS

| | | |
|---|---|---|
| 10,216,685 B1 | 2/2019 | Sartore et al. |
| 10,768,899 B2 * | 9/2020 | Koeplinger ............ G06F 7/768 |
| 10,872,642 B2 | 12/2020 | Charles et al. |
| 11,069,404 B2 * | 7/2021 | Jung ................. G11C 13/0069 |
| 2018/0107406 A1 | 4/2018 | O et al. |

* cited by examiner

BUFFER MEMORY ADAPTED TO IMPLMENT CALCULATIONS HAVING OPERANDS AS DATA

FIELD

The present disclosure generally concerns the field of memory circuits, and more particularly aims the field of non-volatile memory circuits.

BACKGROUND

A known limitation of non-volatile memory circuits is their relatively low endurance, that is, the relatively small maximum number of write cycles that each elementary storage cell can withstand.

It would be desirable to be able to at least partly improve certain aspects of non-volatile memory circuits.

SUMMARY

For this purpose, an embodiment provides a memory device comprising:
  a non-volatile memory circuit;
  a buffer memory circuit comprising a volatile memory circuit;
  an input-output circuit;
  a first data link coupling the non-volatile memory circuit to the buffer memory circuit;
  a second data link coupling the buffer memory circuit to the input-output circuit; and
  a control circuit,
wherein the buffer memory circuit is adapted to implementing calculations having as operands data stored in the volatile memory circuit, the control circuit being adapted to receiving instructions via the input-output circuit, and of accordingly controlling data transfers between the non-volatile memory circuit and the buffer memory circuit via the first data link, data transfers between the buffer memory circuit and the input-output circuit via the second data link, and the implementation of calculation operations within the buffer memory circuit.

According to an embodiment, the control circuit is adapted to controlling the execution of a sequence of a plurality of successive calculation operations within the buffer memory circuit without rewriting an intermediate result into the non-volatile memory circuit.

According to an embodiment, the buffer memory circuit integrates a lookup table for monitoring the validity of the data stored in the volatile memory circuit and matching the addresses of the data stored in the volatile memory circuit and the addresses of the data in the non-volatile memory circuit.

According to an embodiment, the control circuit is configured to, each time an access to data is required, verify, by means of the lookup table, whether the searched data are present in the volatile memory circuit, and if they are, access the data directly in the volatile memory circuit, without using the non-volatile memory circuit.

According to an embodiment, the first data link has a width greater than that of the second data link.

According to an embodiment, the first data link has a width equal to the size of the largest data vector capable of being read at once from the non-volatile memory circuit.

According to an embodiment, the input-output circuit is intended to be connected to a system bus having a data width smaller than the width of the first data link.

According to an embodiment, the buffer memory circuit comprises a calculation circuit coupled to an input-output port of the volatile memory circuit.

According to an embodiment, the control circuit is adapted to receiving calculation instructions via the input-output circuit, each calculation instruction comprising a first field defining a type of operation to be implemented, a second field defining operand addresses, and a third field defining an address for rewriting the result of the operation.

According to an embodiment, the control circuit is adapted to reading a series of instructions to be executed in a program storage memory internal to the memory device, the control circuit being adapted to receiving an instruction for launching the series of instructions via the input-output circuit.

According to an embodiment, the non-volatile memory circuit is a resistive memory circuit, a phase-change memory circuit, or a magnetic memory circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the different elements of the described memory devices has not been detailed, the forming of these elements being within the abilities of those skilled in the art based on the indications of the present description. In particular, the forming of memory circuits adapted to implementing calculation operations has not been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

Unless specified otherwise, the expressions "around", "approximately", "substantially" and "in the order of" signify within 10%, and preferably within 5%.

According to an aspect of the described embodiments, a memory device comprising an array of non-volatile memory cells and, coupled to the array of non-volatile memory cells, a buffer memory circuit comprising an array of volatile memory cells is provided, this circuit being adapted to implementing calculation functions. This enables to make the non-volatile memory "smart", that is, to add calculation capacities thereto, while taking into account the specificities of non-volatile memories and particularly their relatively low endurance, that is, the relatively small maximum number of write cycles that each non-volatile memory cell can withstand. In particular, the provision of a buffer circuit based on volatile memory cells, adapted to implementing calculation functions, enables to limit the accesses to the array of non-volatile memory cells, and thus to limit the wearing of the array of non-volatile memory cells, as will be described in further detail hereafter, particularly in relation with FIG. 2.

Figure 1:
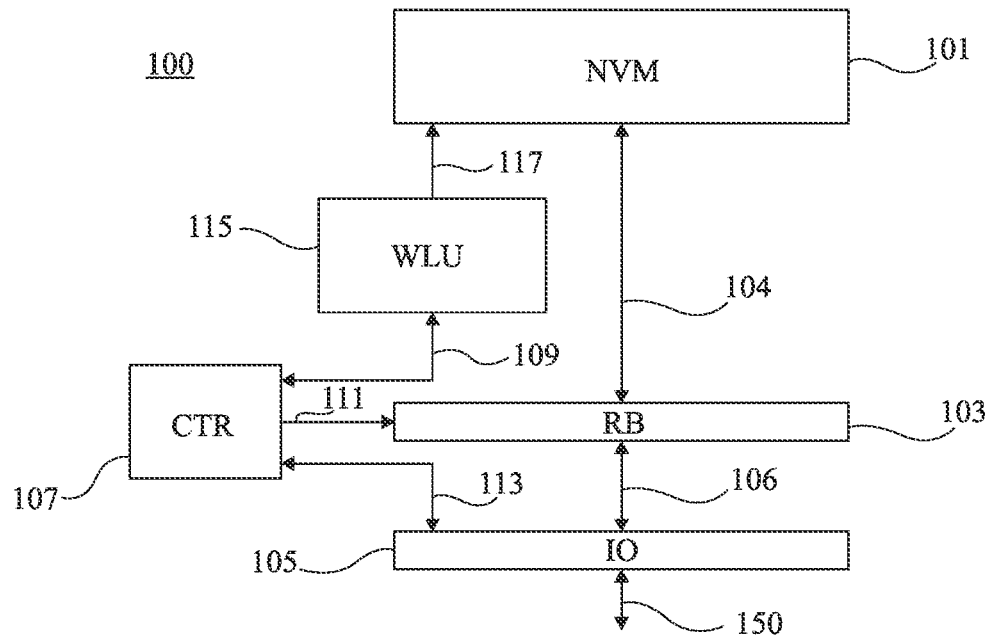
FIG. 1 schematically shows in the form of blocks an example of a memory device.

FIG. 1 schematically shows in the form of blocks an example of a memory device 100 comprising a non-volatile memory circuit 101 (NVM).

Circuit 101 comprises an array of elementary non-volatile memory cells. Circuit 101 is for example a SCM-type ("Storage Class Memory") circuit. As an example, circuit 101 is a resistive memory circuit, for example, a circuit of RRAM or ReRAM ("Resistive Random Access Memory") type, or a phase-change memory circuit (PCM), or a magnetic memory circuit, for example, a circuit of MRAM ("Magnetic Random Access Memory") type.

Device 100 further comprises a buffer memory circuit 103 (RB), also called row buffer, coupled to non-volatile memory circuit 101 by a first bidirectional data transfer link 104. The buffer memory circuit is for example a volatile memory circuit, for example of SRAM ("Static Random Access Memory") type. Buffer memory circuit 103 comprises an array of elementary memory cells. This row has for example the same width as a row of the array of elementary cells of memory circuit 101. Data transfer link 104 preferably has a width equal to the size of the largest data vector capable of being read at once from memory circuit 101, for example equal to the size of a row of readout circuits present at the feet of columns in memory circuit 101, for example, in the range from 512 bits (64 bytes) to 32,768 bits (4,096 bytes).

Device 100 further comprises an input-output circuit 105 (IO) coupled to buffer memory circuit 103 via a second bidirectional data transfer link 106. Input-output circuit 105 is intended to be coupled to an external system bus 150. External system bus 150 may itself be coupled to one or a plurality of processors and/or to one or a plurality of other memory circuits, not shown. As an example, system bus 150 has a data width equal to the width of data transfer link 106. Data transfer link 104 preferably has a width greater than the width of link 106 and than the data width of system bus 150. As an example, the width of link 106 and the data width of system bus 150 are in the range from 32 to 256 bits. Buffer memory circuit 103 is then adapted to serializing the data between link 104 and link 106.

Device 100 further comprises a control circuit 107 (CTR). Control circuit 107 is coupled to non-volatile memory circuit 101 via a control link 109 (and, in this example, a wear management circuit 115 described in further detail hereafter), to buffer memory circuit 103 by a control link 111, and to input-output circuit 105 by a control link 113.

Control circuit 107 is adapted to receiving instructions from an external control unit, for example, a processor, via system bus 150, input-output circuit 105, and link 113, and to controlling circuits 101, 103, and 105 to execute the requested operations.

Control circuit 107 is particularly adapted to controlling data transfers from non-volatile memory circuit 101 to buffer memory circuit 103, via link 104, and then from buffer memory circuit 103 to input-output circuit 105, via link 106. Control circuit 107 is further adapted to controlling data transfers from input-output circuit 105 to buffer memory circuit 103, via link 106, and then from buffer memory circuit 103 to non-volatile memory circuit 101, via link 104.

In the example of FIG. 1, device 100 further comprises a wear leveling unit 115 (WLU). Circuit 115 is adapted to converting addresses called user addresses received from control circuit 107 into addresses called physical addresses corresponding to the effective addresses of the data in non-volatile memory circuit 101. For this purpose, circuit 115 may contain one or a plurality of address translation tables. The role of circuit 115 is to balance the accesses to the different cells of the memory circuit, transparently for the user. Circuit 115 forms an interface between link 109 and non-volatile memory circuit 101. The user addresses are received by circuit 115 via link 109, and are translated into physical addresses transmitted to non-volatile memory circuit 101 via a link 117 coupling circuit 115 to circuit 101.

Figure 2:
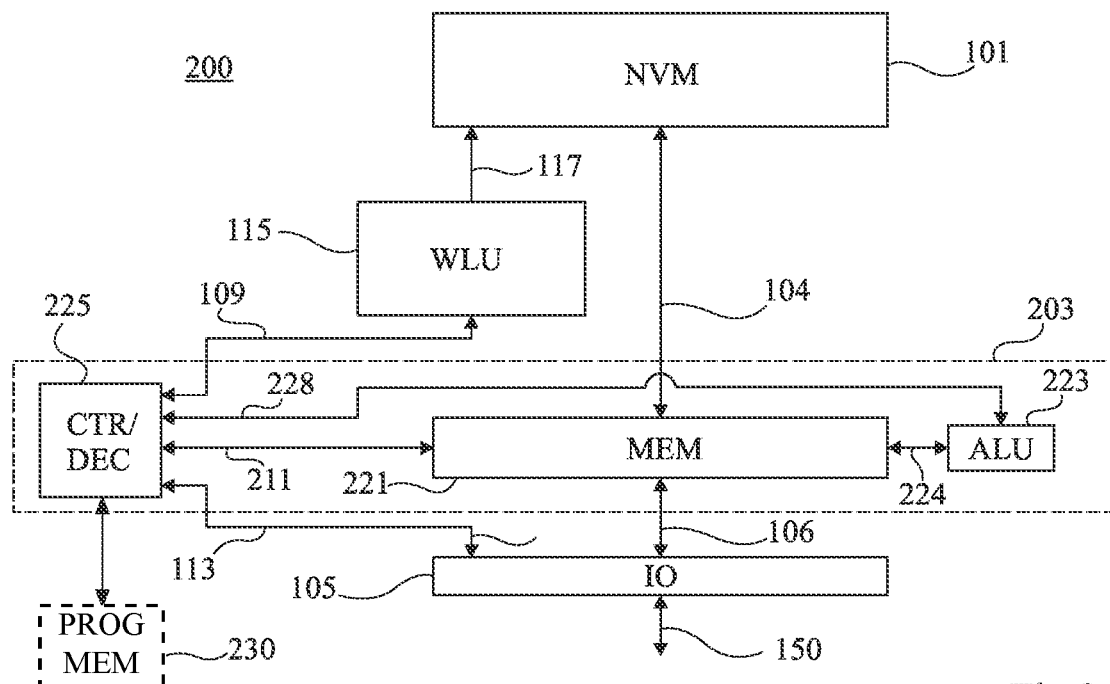
FIG. 2 schematically shows in the form of blocks an example of a memory device according to an embodiment.

FIG. 2 schematically shows in the form of blocks an example of a memory device 200 according to an embodiment.

The memory device 200 of FIG. 2 comprises elements common with the memory device 100 of FIG. 1. These elements will not be detailed again hereafter. In the following, only the differences with respect to the memory device 100 of FIG. 1 will be highlighted.

The memory device 200 of FIG. 2 differs from the memory device 100 of FIG. 1 mainly in that, in memory device 200, the buffer memory circuit 103 and the control circuit 107 of memory device 100 have been replaced with a buffer memory circuit 203.

Buffer memory circuit 203 comprises an array 221 (MEM) of a plurality of rows of elementary volatile storage cells, for example, SRAM cells. Each row of array 221 for example has the same width or substantially the same width as a row of the array of elementary cells of non-volatile memory circuit 101. As an example, each row of array 221 comprises a few additional control bits, for example, from one to two bits of validity and/or monitoring of the modifications with respect to a row of the array of elementary cells of non-volatile memory circuit 101. Data transfer link 104 preferably has a width equal to the size of the largest data vector capable of being read at once from array 221, for example, equal to the size of a row of readout circuits present at the column feet in array 221.

An advantage linked to the use of a SRAM-type buffer memory (array 221) is that SRAMs have a relatively low power consumption as compared with other types of volatile memories, for example, DRAMs ("Dynamic Random Access Memory").

It should further be noted that DRAMs have to be refreshed at each cycle and accordingly require a relatively complex and bulky control circuit to generate these refreshments, which is not the case for SRAMs.

Further, due to the refreshments at each cycle, DRAMs have a read access time significantly longer than SRAMs. Thus, in the case where it is desired to access in read mode so-called missing data, that is, present in non-volatile memory circuit 101 but not present in buffer memory circuit 203, the time of access to the data (buffer memory readout time+non-volatile memory readout time) will be significantly shorter with a SRAM-type buffer memory than with a DRAM-type buffer memory.

Further, an advantage of SRAMS is that their manufacturing method is compatible with that of CMOS ("Complementary Metal Oxide Semiconductor") circuits and of non-volatile memory circuits. In a preferred embodiment, buffer memory circuit 203 and non-volatile memory circuit 101 are integrated on a same integrated circuit chip.

Data link 104 is connected on the one hand to a data input-output port of the array of memory cells 221, and on the other hand to a data input-output port of memory circuit 101. Data link 106 is connected on the one hand to a data input-output port of memory circuit 221, and on the other hand to the input-output circuit 105 of the device.

Circuit 203 is adapted to performing calculations having as operands data stored in the array of elementary storage cells 221, and of rewriting the result of the calculations into this same array 221. The result of a calculation can then be written into non-volatile memory circuit 101 via data link 104, or transmitted to input-output circuit 105 via data link 106, or also only kept in circuit 221 to be used as an operand for a subsequent calculation operation.

More particularly, in the example of FIG. 2, buffer memory circuit 203 further comprises a calculation circuit 223 (ALU). Calculation circuit 223 is coupled to a data input-output port of the array of memory cells 221 by a bidirectional data link 224, for example, of same width or substantially of same width as data link 104. Calculation circuit 223 is preferably a vector calculation circuit, that is, adapted to implementing calculation operations having vector operands, for example, of a width equal to the width of data link 224. During a calculation operation, the operands are read from array 221 and transmitted to calculation circuit 223 via link 224. The result of the operation may be retransmitted to array 221 via link 224, and rewritten into array 221.

Buffer memory circuit comprises a control circuit 225 (CTR/DEC). Circuit 225 is, in this example, adapted to implementing functions similar to those of the circuit 107 of FIG. 1. In particular, control circuit 225 is adapted to controlling data transfers from non-volatile memory circuit 101 to buffer memory circuit 203 and, more particularly, to the array of elementary storage cells 221 of buffer memory circuit 203, via link 104, and then from buffer memory circuit 203 and, more particularly, from the array of elementary storage cells 221 of buffer memory circuit 203 to input-output circuit 105, via link 106. Control circuit 225 is further adapted to controlling data transfers from input-output circuit 105 to buffer memory circuit 203 and, more particularly, to the array of elementary storage cells 221 of buffer memory circuit 203, via link 106, and then from buffer memory circuit 203 and, more particularly, from the array of elementary storage cells 221 of buffer memory circuit 203, to non-volatile memory circuit 101, via link 104.

For this purpose, similarly to what has been described in relation with FIG. 1, control circuit 225 is coupled to non-volatile memory circuit 101 via a control link 109 (and, in this example, wear leveling unit 115), and to input-output circuit 105 by a control link 113. Control circuit 225 is further coupled to volatile memory cell array by over a control link 211.

In the embodiment of FIG. 2, control circuit 225 is further adapted to controlling the execution of calculations within buffer memory circuit 203. For this purpose, circuit 225 is adapted to sending and receiving control signals via link 221. Control circuit 225 is further adapted to sending control signals to calculation circuit 223 via a control link 228.

Control circuit 225 receives read, write, and calculation instructions from an external control unit, for example, a processor, via system bus 150, input-output circuit 105, and link 113. These instructions are decoded and then executed by control circuit 225. More particularly, control circuit 225 controls circuits 101, 221, 223, and 105 to execute the requested operations.

In practice, series of a plurality of successive calculation operations may be implemented within buffer memory circuit 203, without writing the intermediate results into non-volatile memory circuit 101. At the end of the calculations, only the final results may possibly be written into memory circuit 101. This enables to limit the number of accesses, in particular the number of write operations, and thus the wearing of non-volatile memory circuit 101.

Control circuit 225 is adapted to breaking down, if necessary, each received instruction into a sequence of a plurality of sub-operations also called elementary operations. Elementary operation means a read, write, or calculation operation. A calculation operation may possibly simply comprise actuating calculation circuit 223. A calculation operation may also comprise performing an operation of reading from one or a plurality of rows and then actuating calculation circuit 223. Generally, it can be considered that an elementary operation can be performed within one cycle of access to array 221. The instructions sent by control circuit 225 may be simple instructions corresponding to a single request for writing into or reading from array 221 with no calculation operations, or may be complex instructions capable of requiring in practice the execution of a plurality of elementary read, write, or calculation operations. Thus, circuit 225 will perform a breaking down of a received instruction into a sequence of a plurality of elementary operations only when it receives a smart instruction. The smart instructions are, after decoding, transformed into a flow of elementary operations or, in other words, a sequence of elementary operations. For example, if a smart instruction corresponds to the "AND" logic operation between two operands and to the storage of the result, the elementary sequence corresponding to this smart instruction will for example correspond to 1) reading a first operand from memory array 221, 2) reading a second operand from memory array 221, 3) calculating the "AND" logic operation by means of circuit 223, and 4) writing the result into memory array 221.

The format of the instructions received from the processor via input-output circuit 105 is for example similar to what has been described in patent application EP3503103 previously filed by the applicant. In particular, as for the calculation instructions, each calculation instruction may comprise a first field defining a type of operation to be implemented, a second field defining the addresses of the operands, and a third field defining an address for rewriting the result of the operation.

Preferably, the array 221 of memory cells of buffer memory circuit 203 is managed similarly to a cache memory. This means that as long as this is possible, that is, as long as array 221 contains enough space, the data transiting through buffer memory circuit 203 remain stored in array 221. Thus, these data are directly accessible by processor or calculation circuit 223, without having to access non-volatile memory 101. The data contained in buffer memory circuit 203 are written into non-volatile memory circuit 101 only when the buffer memory is full, and the corresponding rows of array 221 have to be freed to receive new data. This enables to limit the number of read or write accesses to non-volatile memory circuit 101, and thus to limit the wearing of non-volatile memory circuit 101. Thus, each time data from non-volatile memory 101 are requested to be read, be it to implement a calculation or to read the data from the outside of the device, via input-output circuit 105, the control circuit first verifies, via bidirectional link 211, whether these data are present in memory circuit 221. If the data are present, they may be read directly from memory circuit 221. If the data are absent from memory circuit 221, the data are read from non-volatile memory circuit 101 and written into memory circuit 221 before being sent to the requesting party (which may be calculation circuit 223 or input-output circuit 105). The volatile memory circuit 221 of buffer memory circuit 203 is not memory-mapped, that is, its addresses are not directly accessible by an external device.

In the case of a writing (writing of the result of a calculation operation performed by calculation circuit 223 or writing of data received from the outside via input-output circuit 105), the data are first written into memory circuit 221. The writing into non-volatile memory 101 may be triggered by the control circuit when buffer memory circuit 203 is full and rows of array 221 have to be freed, for example, when a full data row is ready to be written into memory circuit 101, or when the final result of a calculation sequence is ready to be written into memory circuit 101.

Buffer memory circuit 203 preferably comprises an address lookup and validity monitoring table for the data stored in memory circuit 221. This table (not detailed in the figure) is for example stored in circuit 221 itself, or in a memory of control circuit 225. This table is used by control circuit 225 to determine whether the addressed data are present in circuit 221 or if they have to be read from or written into memory circuit 101.

The memory device 200 of FIG. 2 forms a "smart" memory device, that is, adapted not only to storing data, in non-volatile memory 101, but also to implementing calculation operations in buffer memory circuit 203. The device may be controlled by an external processor via input-output circuit 105. The processor may send simple read or write instructions, or complex instructions, particularly comprising calculation instructions. These instructions are decoded and executed by control circuit 225. Only non-volatile memory 101 is addressable by the processor. Volatile memory 221 is not mapped, that is, its addresses are not directly accessible by the processor. In other words, volatile memory 221 is not visible by the processor. Data transfers between non-volatile memory 101 and volatile memory 221 are managed by control circuit 225 (and not by the external system) to minimize accesses to non-volatile memory 101, and thus limit the wearing of memory 101. As an example, write operations into non-volatile memory 101 are only performed when volatile memory 221 is full. Thus, the larger the size of volatile memory 221, the more the number of read or write accesses to non-volatile memory 101 can be decreased. Thus, seen from the outside, memory device 200 corresponds to a smart slave memory device, for example, addressable similarly to what has been described in above-mentioned patent application EP3503103.

In the example of FIG. 2, non-volatile memory circuit 101 only comprises an array of non-volatile elementary storage cells as well as peripheral circuits for reading and writing data from and into the array. As a variant, the assembly comprising memory circuit 101 and wear management circuit 115 may be replaced with a full non-volatile memory circuit of the type described in relation with FIG. 1. In this case, link 109 couples control circuit 225 directly to the input-output circuit of the non-volatile memory device. The signals generated by circuit 225 to control the non-volatile memory device may be accordingly adapted.

Various embodiments and variants have been described. Those skilled in the art will understand that certain features of these various embodiments and variants may be combined, and other variants will occur to those skilled in the art. It should in particular be noted that the code to be executed by the memory device may be stored in a program storage memory internal to the device, for example, volatile memory circuit 221, or in another internal memory 230 directly accessible by control circuit 225. In this case, it is possible for the external processor to only send synchronization signals, for example, an instruction for starting a task. This enables to decrease the traffic between the external processor and the memory device.

Further, calculation circuit 223 may be specialized according to the type or processing which is desired to be performed.

Further, the smart buffer memory circuit 203 described in relation with FIG. 2 may be adapted, particularly by replacing the assembly formed by volatile memory circuit 221 and calculation circuit 223 with other types of smart memory circuits, that is, adapted to implementing calculation functions, for example smart memory circuits of the type described in patent applications EP3252774 and EP3503103 previously filed by the applicant. The control signals generated by circuit 225 may then be accordingly adapted.

Further, volatile memory circuit 221 may have a plurality of input-output ports (not detailed in the figures) to enable to accelerate transfers from calculation circuit 223, and/or, for example, to transfer in parallel data from non-volatile memory circuit 101 to input-output circuit 105 and send data to calculation circuit 223.

Many applications are likely to take advantage of a memory device of the above-described type, coupling to a non-volatile memory a buffer memory circuit adapted to implementing calculation operations. As a non-limiting example, such a device may be advantageous for applications of database processing, of ciphering/deciphering of data on a disk, of neural networks, of BLAS ("Basic Linear Algebra Subprograms"), etc.

Finally, the practical implementation of the described embodiments and variations is within the abilities of those skilled in the art based on the functional indications given hereabove. In particular, the detailed forming of the different circuits and links of the described devices is within the abilities of those skilled in the art based on the functional indications of the present description.

What is claimed is:

1. Memory device comprising:
   a non-volatile memory circuit;
   a buffer memory circuit comprising a volatile memory circuit;
   an input-output circuit;
   a first data link coupling the non-volatile memory circuit to the buffer memory circuit;
   a second data link coupling the buffer memory circuit to the input-output circuit; and
   a control circuit,
   wherein the buffer memory circuit is adapted to implementing calculations having as operands data stored in the volatile memory circuit, the control circuit being adapted to receiving instructions via the input-output circuit, and of accordingly controlling data transfers between the non-volatile memory circuit and the buffer memory circuit via the first data link, data transfers between the buffer memory circuit and the input-output circuit via the second data link, and the implementation of calculation operations within the buffer memory circuit, wherein the control circuit controls the buffer memory circuit to manage the volatile memory circuit like a cache memory, and wherein the buffer memory circuit integrates a lookup table for monitoring the validity of the data stored in the volatile memory circuit and matching addresses of the data stored in the volatile memory circuit and addresses of the data in the non-volatile memory circuit.

2. Memory device according to claim 1, wherein the volatile memory circuit of the buffer memory circuit is a SRAM memory.

3. Memory device according to claim 2, wherein the volatile memory circuit of the buffer memory circuit and the non-volatile memory circuit are integrated on a same integrated circuit chip.

4. Memory device according to claim 1, wherein the control circuit is adapted to controlling the execution of a sequence of a plurality of successive calculation operations within the buffer memory circuit without rewriting an intermediate result into the non-volatile memory circuit.

5. Device according to claim 1, wherein the control circuit is configured to, each time an access to data is required, verify, by means of the lookup table, whether searched data are present in the volatile memory circuit, and if they are, access the data directly in the volatile memory circuit, without using the non-volatile memory circuit.

6. Memory device according to claim 1, wherein the first data link has a width greater than that of the second data link.

7. Memory device according to claim 1, wherein the first data link has a width equal to the size of the largest data vector capable of being read at once from the non-volatile memory circuit.

8. Memory device according to claim 1, wherein the input-output circuit is configured to be connected to a system bus having a data width smaller than a width of the first data link.

9. Memory device according to claim 1, wherein the buffer memory circuit comprises a calculation circuit coupled to an input-output port of the volatile memory circuit.

10. Memory device according to claim 1, wherein the control circuit is adapted to receiving calculation instructions via the input-output circuit, each calculation instruction comprises a first field defining a type of operation to be implemented, a second field defining operand addresses, and a third field defining an address for rewriting a result of the operation.

11. Memory device according to claim 1, wherein the control circuit is adapted to reading a series of instructions to be executed in a program storage memory internal to the memory device, the control circuit being adapted to receiving an instruction for launching the series of instructions via the input-output circuit.

12. Memory device according to claim 1, wherein the non-volatile memory circuit is a resistive memory circuit, a phase-change memory circuit, or a magnetic memory circuit.

13. Memory device comprising:
a non-volatile memory circuit;
a buffer memory circuit comprising a volatile memory circuit;
an input-output circuit;
a first data link coupling the non-volatile memory circuit to the buffer memory circuit;
a second data link coupling the buffer memory circuit to the input-output circuit; and
a control circuit,
wherein the buffer memory circuit is adapted to implementing calculations having as operands data stored in the volatile memory circuit, the control circuit being adapted to receiving instructions via the input-output circuit, and of accordingly controlling data transfers between the non-volatile memory circuit and the buffer memory circuit via the first data link, data transfers between the buffer memory circuit and the input-output circuit via the second data link, and the implementation of calculation operations within the buffer memory circuit,
wherein the control circuit controls the buffer memory circuit to manage the volatile memory circuit like a cache memory,
and wherein the control circuit is adapted to receiving calculation instructions via the input-output circuit, each calculation instruction comprises a first field defining a type of operation to be implemented, a second field defining operand addresses, and a third field defining an address for rewriting a result of the operation.

* * * * *